United States Patent
Saito (10) Patent No.: US 7,220,785 B2
(45) Date of Patent: May 22, 2007

(54) ANISOTROPICALLY CONDUCTIVE ADHESIVE COMPRISING CRUSHABLE MICROCAPSULES ADHERED TO A SURFACE OF CONDUCTIVE PARTICLES

(75) Inventor: Atsushi Saito, Chino (JP)

(73) Assignee: Seiko Epson Corporation, Tokyo (JP)

( * ) Notice: Subject to any disclaimer, the term of this patent is extended or adjusted under 35 U.S.C. 154(b) by 366 days.

(21) Appl. No.: 10/812,037

(22) Filed: Mar. 30, 2004

(65) Prior Publication Data

US 2004/0234763 A1   Nov. 25, 2004

(30) Foreign Application Priority Data

May 12, 2003   (JP)   ............... 2003-133020

(51) Int. Cl.
  *B01F 3/12*    (2006.01)
  *B32B 5/16*    (2006.01)
  *B32B 7/12*    (2006.01)
  *B32B 15/04*   (2006.01)

(52) U.S. Cl. .................. 516/31; 428/328; 428/356; 428/402.21; 428/407

(58) Field of Classification Search .................. 516/20
  See application file for complete search history.

(56) References Cited

U.S. PATENT DOCUMENTS

| | | | |
|---|---|---|---|
| 5,194,502 A * | 3/1993 | Saito et al. | 525/111 |
| 5,302,456 A | 4/1994 | Matsui | |
| 6,429,382 B1 * | 8/2002 | Amami et al. | 174/259 |
| 6,777,464 B1 * | 8/2004 | Watanabe et al. | 523/457 |
| 7,110,163 B2 * | 9/2006 | Webber et al. | 359/296 |
| 2002/0084019 A1 * | 7/2002 | Date et al. | 156/206 |

FOREIGN PATENT DOCUMENTS

| | | | |
|---|---|---|---|
| JP | A 02-036289 | | 2/1990 |
| JP | 04332404 A | * | 11/1992 |
| JP | A 05-235096 | | 9/1993 |
| JP | A 05-230586 | | 12/1993 |
| JP | A-05-320586 | | 12/1993 |
| JP | 08003529 A | * | 1/1996 |
| JP | B2 2623762 | | 4/1997 |
| JP | A 2001-176924 | | 6/2001 |
| WO | WO 9844067 | * | 8/1998 |

* cited by examiner

*Primary Examiner*—Randy Gulakowski
*Assistant Examiner*—Timothy J. Kugel
(74) *Attorney, Agent, or Firm*—Oliff & Berridge, PLC (57) ABSTRACT

This invention provides a mounting method for reliably connecting mounting components electrically. Specifically, an anisotropically conductive adhesive can be composed of crushable microcapsules and a second liquid in which the microcapsules are dispersed. Each microcapsule encloses a first liquid and a conductive particle. The first liquid can react with the second liquid at normal temperatures to cure the second liquid. This anisotropically conductive adhesive can be applied on a flexible printed circuit (FPC). Then, a drive IC is mounted and pressed on the FPC to crush the microcapsules between electrode pads provided on the drive IC and electrode pads provided on the FPC, thereby bonding the electrode pads. Subsequently, the anisotropically conductive adhesive is heated to plasticize a capsule wall of each microcapsule, thereby bonding the drive IC and the FPC.

5 Claims, 5 Drawing Sheets

PRIOR ART

ANISOTROPICALLY CONDUCTIVE ADHESIVE COMPRISING CRUSHABLE MICROCAPSULES ADHERED TO A SURFACE OF CONDUCTIVE PARTICLES

BACKGROUND OF THE INVENTION

1. Field of Invention

The present invention relates to anisotropically conductive adhesives, mounting methods, electro-optical device modules, and electronic devices.

2. Description of Related Art

Figure 6:
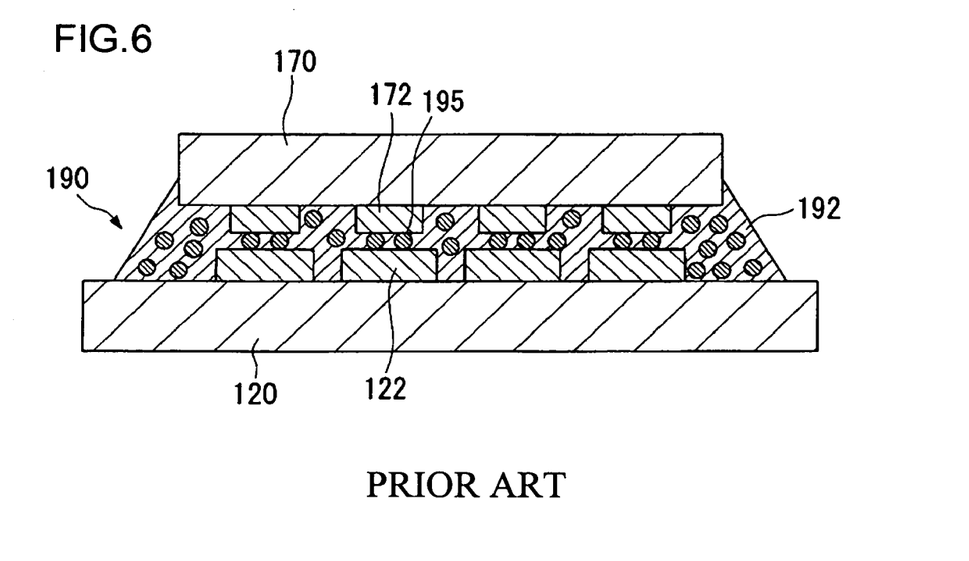
FIG. 6 illustrates a mounting method according to the related art.

Electronic components, such as ICs, are often mounted on a circuit board. Various methods for mounting electronic components on a circuit board have been proposed. FIG. 6 illustrates a mounting method according to the related art. In FIG. 6, an IC 170 is mounted on a substrate 120 with an anisotropically conductive film (ACF) 190 therebetween. This anisotropically conductive film 190 is composed of a thermosetting resin 192 and conductive particles 195 dispersed in the thermosetting resin 192. Some of the conductive particles 195 are held between electrode pads 172 formed on an active surface of the IC 170 and electrode pads 122 formed on a surface of the substrate 120 to connect the IC 170 and the substrate 120 electrically. On the other hand, the thermosetting resin 192 is cured by heating to connect the IC 170 and the substrate 120 mechanically. The cured thermosetting resin 192 also serves to protect the electrical connections between the IC 170 and the substrate 120.

SUMMARY OF THE INVENTION

In general, the materials for the IC 170 and the substrate 120 have different linear expansion coefficients, for example, silicon for the IC 170 has a linear expansion coefficient of 4.15 ppm/K while a polyimide resin for the substrate 120 has a linear expansion coefficient of 20 to 60 ppm/K. Therefore, when the anisotropically conductive film 190 is cured by heating, the substrate 120 expands more than the IC 170. As a result, the substrate 120 and the IC 170 may be bonded such that the positions of the electrode pads 122 on the substrate 120 deviate from those of the corresponding electrode pads 172 on the IC 170. This deviation impairs the electrical connection between the IC 170 and the substrate 120. Furthermore, this deviation inhibits the development of a narrower pitch of electrodes, which has been studied in response to the demand for the reduction in the size of electronic devices.

In a liquid crystal display module, as in the above example, a flexible printed circuit (FPC) with an IC can be mounted on a glass substrate of a liquid crystal display panel with an anisotropically conductive film. Also for this module, the positions of corresponding electrodes may deviate from each other because the glass substrate has a different linear expansion coefficient from the FPC. Furthermore, the deviation is readily widened because the FPC and the glass substrate share a large mounting area.

Japanese Patent No. 2623762 and Japanese Unexamined Patent Application Publication No. 2001-176924 disclose anisotropically conductive adhesives containing microcapsules. An anisotropically conductive adhesive of Japanese Patent No. 2623762 contains microcapsules enclosing a curing agent. These microcapsules are crushed to discharge the curing agent, which cures the adhesive. This curing agent, which can cure portions of the adhesive around crushed microcapsules, cannot cure the rest of the adhesive separated from the crushed microcapsules. On the other hand, an anisotropically conductive adhesive of Japanese Unexamined Patent Application Publication No. 2001-176924 contains microcapsules enclosing an exothermic agent. These microcapsules are crushed to discharge the exothermic agent, which heats and cures the adhesive. These microcapsules, however, are difficult to prepare due to their large size.

To solve the above problems, the invention can provide an anisotropically conductive adhesive that can reliably connect mounting components electrically and a mounting method, electro-optical device module, and electronic device using the anisotropically conductive adhesive.

An anisotropically conductive adhesive according to the invention can include crushable microcapsules each of which encloses a first substance and a conductive particle; and a second substance that is curable by a reaction with the first substance. These microcapsules are dispersed in the second substance. Another anisotropically conductive adhesive according to the present invention includes conductive particles; and the second substance that is curable by a reaction with the first substance. Each of the crushable microcapsules enclosing the first substance adheres to each of the conductive particles. These conductive particles are dispersed in the second substance.

Preferably, the first substance is any substance or mixture of amines, imidazoles, acid anhydrides, and phenols, and the second substance is an uncured epoxy resin. Alternatively, the first substance may be an uncured epoxy resin while the second substance is any substance or mixture of amines, imidazoles, acid anhydrides, and phenols.

When either of the anisotropically conductive adhesives is used to bond a pair of mounting components, the microcapsules are crushed between mounting conductors provided on these mounting components to discharge the first substance. The discharged first substance reacts with the second substance to cure the adhesive around the conductive particles held between the mounting conductors at normal temperatures or 100° C. or less (namely, temperatures low enough not to plasticize thermoplastic capsule walls that will be described below). These anisotropically conductive adhesives allow the bonding of the mounting conductors at a high curing speed without heating to prevent the deviation of the positions of the mounting conductors, even if the mounting components have different linear expansion coefficients. These anisotropically conductive adhesives, therefore, can provide reliable electrical connection between the mounting components.

The capsule walls of the microcapsules are preferably composed of a thermoplastic resin. In addition, the second substance preferably contains a third substance that is curable by a reaction with the second substance. This reaction occurs by heating.

When, for example, the anisotropically conductive adhesive of Japanese Patent No. 2623762 is used to bond the mounting components, as described above, the portions of the adhesive between the mounting conductors are cured but the rest of the adhesive is not cured. On the other hand, each anisotropically conductive adhesive of the present invention is heated to plasticize the capsule walls. Then, the microcapsules discharge the first substance, which reacts with the second substance to cure the overall anisotropically conductive adhesive. In addition, by heating, the third substance reacts with the second substance to cure the overall anisotropically conductive adhesive. The curing of the first, second, and third substances, therefore, can provide mechanical connection between the mounting components.

A mounting method according to the invention can include the steps of applying either of the above anisotropically conductive adhesives onto either mounting surface of a pair of mounting components, and pressing the pair of mounting components to crush the microcapsules between mounting conductors provided on the pair of mounting components, thereby causing the mounting conductors to hold the conductive particles and bonding the mounting conductors with each other.

According to this mounting method, the microcapsules are crushed between mounting conductors provided on the mounting components to discharge the first substance. The discharged first substance reacts with the second substance to cure the adhesive around the conductive particles held between the mounting conductors at normal temperatures or 100° C. or less. This method allows the bonding of the mounting conductors without heating to prevent the deviation of the positions of the mounting conductors, even if the mounting components have different linear expansion coefficients. This method, therefore, can provide reliable electrical connection between the mounting components.

Another mounting method according to the invention can include the steps of applying either of the above anisotropically conductive adhesives onto either mounting surface of a pair of mounting components, pressing the pair of mounting components to crush the microcapsules between mounting conductors provided on the pair of mounting components, thereby causing the mounting conductors to hold the conductive particles and bonding the mounting conductors with each other; and curing the anisotropically conductive adhesive by heating to bond the pair of mounting components with each other.

According to this mounting method, the anisotropically conductive adhesive is heated after the pair of the mounting components are electrically connected. Then, the second substance reacts with the first substance and the third substance to cure the overall anisotropically conductive adhesive. Thus, the mounting components can be electrically connected. During the heating, the positions of the mounting conductors are not deviated because the mounting conductors have been already bonded. This method, therefore, can provide reliable electrical connection between the mounting components.

In an electro-optical device module manufactured by either of the above mounting methods, one of the pair of mounting components is a substrate having display elements and constituting a part of an electro-optical device, and the other of the pair of mounting components is a substrate on which a drive device for the display elements is mounted.

In general, when a substrate of an electro-optical device and a substrate on which a drive element is mounted are bonded, the positions of their mounting conductors are readily deviated due to their large mounting area. The above mounting methods, however, do not cause such deviation, thus providing reliable electrical connection between both substrates.

An electronic device according to the present invention is manufactured by either of the above mounting methods. This device, therefore, can have the above advantages.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Embodiments of the present invention will now be described with reference to the drawings, in which the scale of each component is properly changed for visibility.

Figure 2:
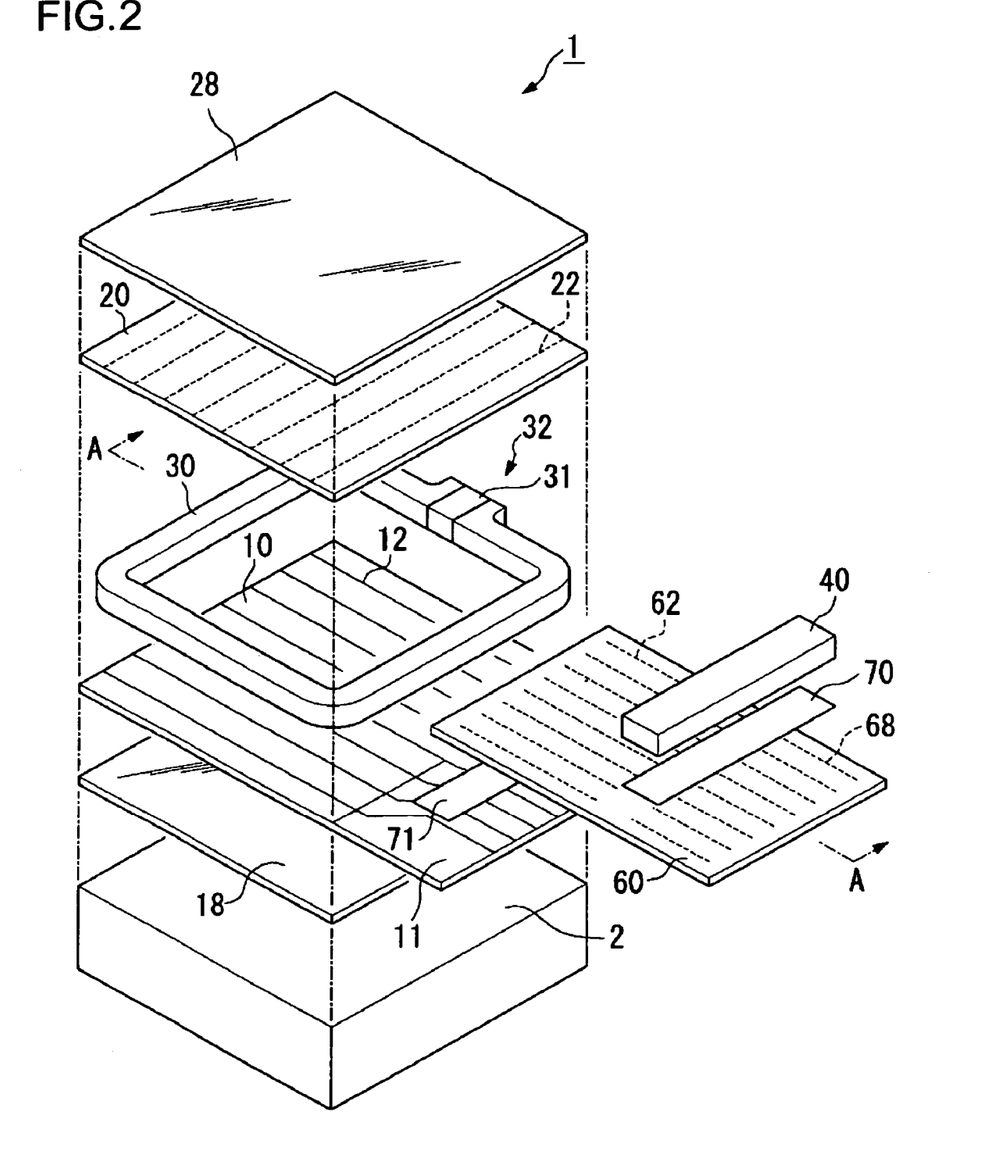
FIG. 2 is an exploded perspective view of a liquid crystal display module.
Figure 3:
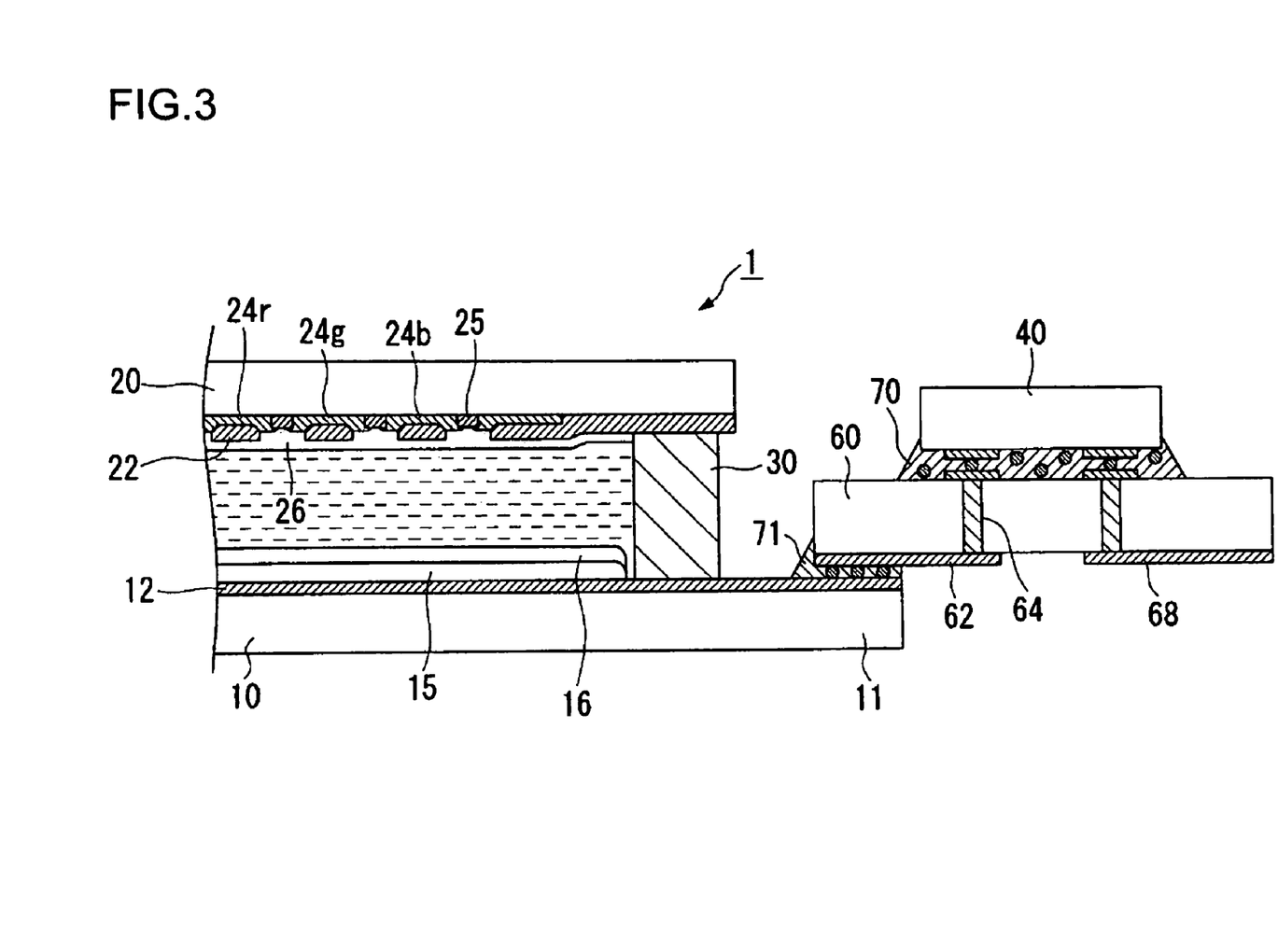
FIG. 3 is a sectional side view taken along line A—A in FIG. 2.

A liquid crystal display module, as an embodiment of electro-optical device modules according to the present invention, will now be described with reference to FIGS. 2 and 3. FIG. 2 is an exploded perspective view of this liquid crystal display module. FIG. 3 is a sectional side view taken along line A—A in FIG. 2. This liquid crystal display module is mainly composed of a liquid crystal display panel 1, an FPC 60 mounted on the liquid crystal display panel 1, and a drive IC 40 mounted on the FPC 60. In this embodiment, the liquid crystal display panel 1 is a passive matrix display panel, though the present invention may also apply to an active matrix display panel. It should be understood that this liquid crystal display module is only schematically illustrated in FIGS. 2 and 3, in practice it has more components, such as electrodes and terminals.

The liquid crystal display panel 1, as shown in FIG. 2, includes a pair of a lower substrate 10 and an upper substrate 20 that are opposed to each other. These substrates 10 and 20 are composed of a transparent material, such as glass. These substrates 10 and 20 are separated by spacers in bead form (not shown in the drawings). The diameter of these spacers defines the space between the substrates 10 and 20. The spacers maintain this space to, for example, approximately 5 μm. The substrates 10 and 20 are bonded at their peripheries with a sealing adhesive 30, such as a thermosetting adhesive and an ultraviolet-curable adhesive. This sealing adhesive 30 is provided with a liquid crystal inlet 32 protruding from the substrates 10 and 20. Liquid crystal is injected into the space surrounded by the substrates 10 and 20 and the sealing adhesive 30 before the liquid crystal inlet 32 is sealed with a stopper 31.

An entrance polarizer 18 is disposed below the lower substrate 10 and an exit polarizer 28 is disposed above the upper substrate 20 such that their polarization axes (penetrating axes) are tilted by 90°. A backlight 2 is disposed below the entrance polarizer 18. When light emitted by the backlight 2 becomes incident on the entrance polarizer 18, only light polarized linearly along the polarization axis of the entrance polarizer 18 can pass the entrance polarizer 18. This linearly polarized light then passes through a liquid crystal layer held by the substrates 10 and 20 to rotate according to the alignment of liquid crystal molecules. If the polarization axis of the light agrees with that of the exit polarizer 28, this linearly polarized light can pass through the exit polarizer 28 to construct an image.

Scanning electrodes 22 composed of a transparent conductive material, such as indium tin oxide (ITO), are formed in stripes on the inner surface of the upper substrate 20. Meanwhile, signal electrodes 12 composed of a transparent conductive material such as ITO are formed in stripes on the inner surface of the lower substrate 10. The scanning electrodes 22 and the signal electrodes 12 are orthogonally disposed. The pixel areas of the liquid crystal display panel 1 are formed around the intersecting points of the scanning electrodes 22 and the signal electrodes 12. When one scanning electrode 22 is supplied with a scanning signal and one signal electrode 12 is supplied with a data signal, voltage is applied to the liquid crystal layer at the intersecting point of the scanning electrode 22 and the signal electrode 12. The level of the applied voltage determines the alignment of the liquid crystal molecules, and this alignment determines the rotation angle of the linearly polarized light incident on the liquid crystal layer. This mechanism allows the liquid crystal display panel 1 to display an image.

FIG. 3 is a sectional side view taken along line A—A in FIG. 2: Red, green, and blue color filter layers 24r, 24g, and 24b, respectively, are formed at the individual pixel areas on the inner surface of the upper substrate 20. These color filter layers 24r, 24g, and 24b enable the liquid crystal display panel 1 to display a color image. The color filter layers 24r, 24g, and 24b are separated by light-shielding films 25 to prevent light leakage from adjacent pixel areas. The scanning electrodes 22 are formed on the color filter layers 24r, 24g, and 24b. An alignment layer 26 is formed over the scanning electrodes 22.

On the other hand, the signal electrodes 12 are formed on the top surface of the lower substrate 10. An overcoat 15 is formed on the signal electrodes 12. Another alignment layer 16 is formed on the overcoat 15. This alignment layer 16 determines the alignment of the liquid crystal molecules when no voltage is applied. The alignment layers 16 and 26 are formed such that the alignment of the liquid crystal molecules determined by the alignment layer 16 is tilted by 90° from that determined by the alignment layer 26.

The lower substrate 10 is extended outward from below the upper substrate 20 to form an extended portion 11 along which the signal electrodes 12 are extended. An end of the FPC 60 is mounted on the extended portion 11 with an anisotropically conductive adhesive 71 according to the present invention. Connection electrodes 68 corresponding to the signal electrodes 12 are formed on the bottom of the end of the FPC 60. The anisotropically conductive adhesive 71 provides the electrical connection between the connection electrodes 68 on the FPC 60 and the signal electrodes 12 on the lower substrate 10.

Meanwhile, additional connection electrodes 68 are formed on the bottom of the other end of the FPC 60 to connect the FPC 60 to another circuit board. The connection electrodes 68 on both ends are wired to the top surface of the FPC 60 through penetrating electrodes 64 extending from the top to the bottom of the FPC 60. The drive IC 40 is mounted on the FPC 60 with an anisotropically conductive adhesive 70 according to the present invention. This drive IC 40 activates the signal electrodes 12 in response to signals from the above circuit board.

An anisotropically conductive adhesive according to the invention will now be described with reference to FIGS. 4(a) and 4(b). The anisotropically conductive adhesive of the invention contains a pair of liquids: a first liquid contained in microcapsules and a second liquid in which the microcapsules are dispersed. These liquids react with each other to cure at normal temperatures or low temperatures, namely, 100° C. or less. An example of the second liquid is an uncured epoxy resin while an example of the first liquid is any substance or mixture of amines, imidazoles, acid anhydrides, and phenols. These materials for the first liquid serve to bridge main chains of the epoxy resin, namely, the second liquid.

Among them, amines can react with an epoxy resin to cure in a short time, reducing the time required for mounting. The materials for the first and second liquids may be exchanged.

Figure 4A:
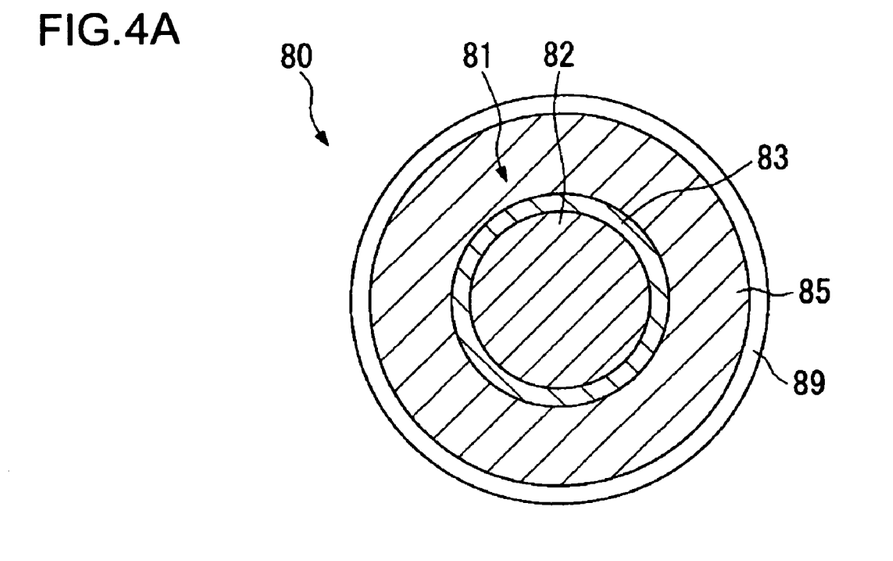
FIGS. 4(a) and 4(b) are sectional views of microcapsules.
Figure 4B:
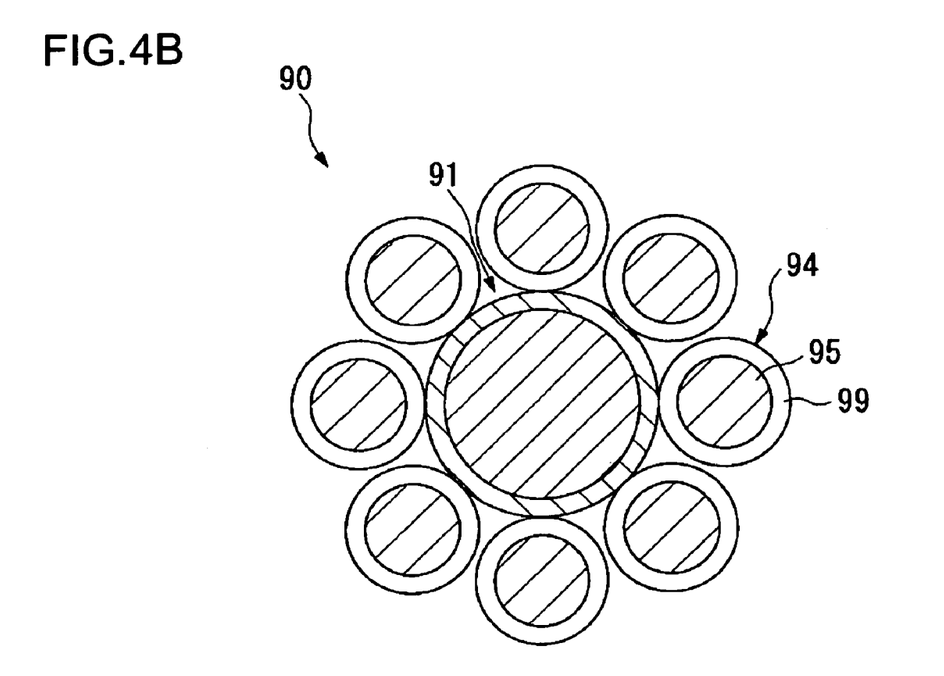

FIG. 4(a) is a sectional view of a microcapsule for dispersion in the anisotropically conductive adhesive of the invention. In FIG. 4(a), microcapsules 80 each enclose a conductive particle 81 prepared by coating a resin ball 82 with a metal plating 83. The resin ball 82 has a diameter of approximately 3.5 to 5.0 μm. The metal plating 83 is composed of an inner nickel plating and an outer silver plating, providing the conductive particle 81 with conductivity. The microcapsules 80 contain a first liquid 85 around the conductive particle 81. In other words, the conductive particle 81 is further coated with the first liquid 85. The conductive particle 81 and the first liquid 85 are sealed in a capsule wall 89 of each microcapsule 80.

The capsule wall 89 is preferably composed of a thermoplastic resin, such as a polyamide resin and an acrylic resin.

If the capsule wall 89 is composed of a polyamide resin, the microcapsules 80 may be formed by, for example, interfacial polymerization. First, the core material for the microcapsules 80 is dispersed in water. Then, a first starting material for the polyamide resin is dissolved in the water to form an aqueous solution. This solution is poured into oil, which is then stirred to disperse water droplets of the solution. Subsequently, a second starting material for the polyamide resin is added to this dispersion system. Then, the second starting material reacts with the first starting material contained in the water droplets at the interfaces between the water droplets and the oil. This reaction produces polyamide resin walls surrounding the water droplets to form the microcapsule 80. The water and the oil may be exchanged.

If, on the other hand, the capsule wall 89 is composed of an acrylic resin, the microcapsules 80 may be formed by, for example, dry mixing. First, the core material for the microcapsules 80 can be mixed with acrylic resin particles about one tenth as large as particles of the core material while these acrylic resin particles are compressed by mechanical stress. Then, the acrylic resin particles adhere to the overall surface of each particle of the core material to form the capsule wall 89 of each microcapsule 80. This process may be repeated to form multiple capsule walls.

The microcapsules 80 may also be formed by, for example, chemical methods, such as in-situ polymerization, mechanical methods, such as spray drying, and physicochemical methods such as liquid drying and coacervation.

The capsule wall 89 may be composed of a porous material. Then, the first liquid 85 is injected between the conductive particle 81 and the capsule wall 89 to form the microcapsules 80.

The microcapsules 80 having the above structure are dispersed in the second liquid, which is composed of, for example, an uncured epoxy resin, to prepare the anisotropically conductive adhesive according to the present invention. The second liquid is preferably mixed with a third liquid that reacts with the second liquid to cure by heating to 100° C. or more. Specifically, if the second liquid used is an epoxy resin, the third liquid used is any substance or mixture of imidazoles, acid anhydrides, and phenols. The reaction of these materials with an epoxy resin, requiring a long time at normal temperatures, only takes a short time if the mixed liquid is heated.

Instead of the microcapsules 80 described above, composites 90 shown in FIG. 4(b) may be dispersed in the second liquid. These composites 90 can each compose of a conductive particle 91 similar to the conductive particle 81 and a plurality of microcapsules 94 adhering to the conductive particle 91. The microcapsule 94, which is formed in the same way as the microcapsules 80, is composed of a capsule wall 99 of a thermoplastic resin and a first liquid 95 enclosed inside the capsule wall 99. A part of the surface of the capsule wall 99 is plasticized to adhere to the surface of the conductive particle 91.

The capsule walls 89 and 99 may be composed of organic materials other than thermoplastic resins or inorganic materials such as silicon oxide ($SiO_2$). Then, the anisotropically conductive adhesive is prepared by, as described above, mixing the second liquid and the third liquid, which reacts with the second liquid to cure the adhesive by heating.

Figure 1A:
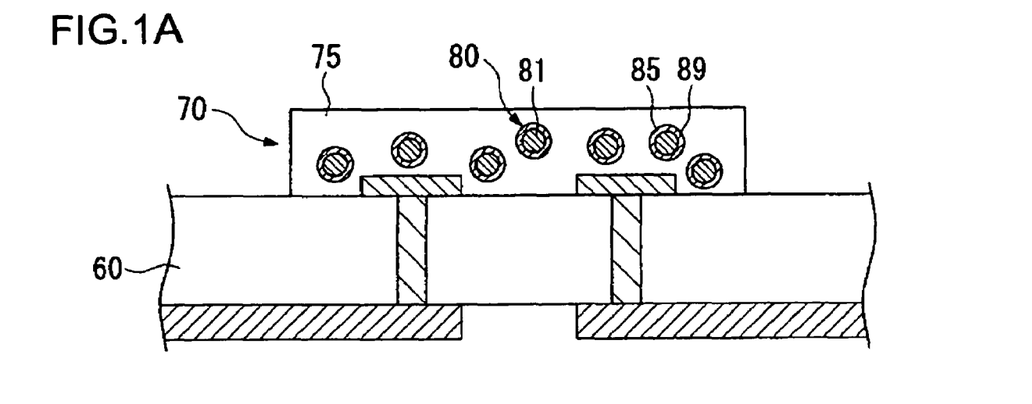
FIGS. 1(a), 1(b), and 1(c) illustrate a mounting method according to an embodiment of the present invention.
Figure 1B:
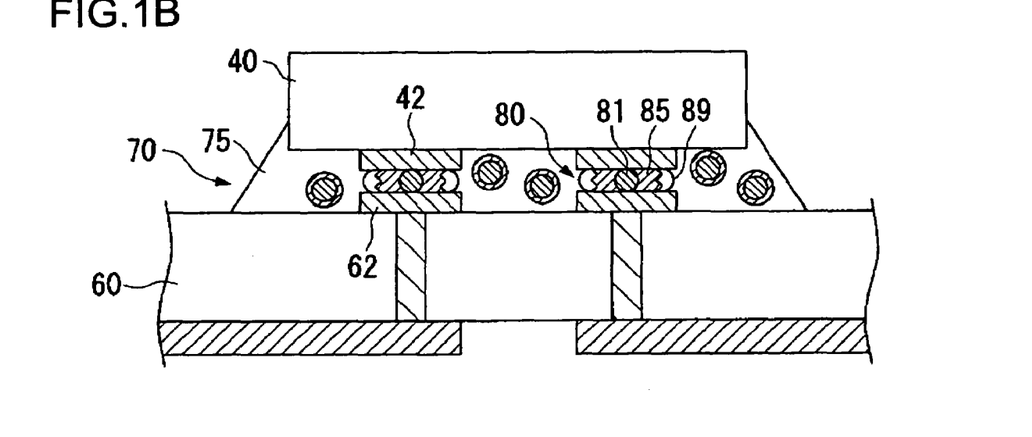
Figure 1C:
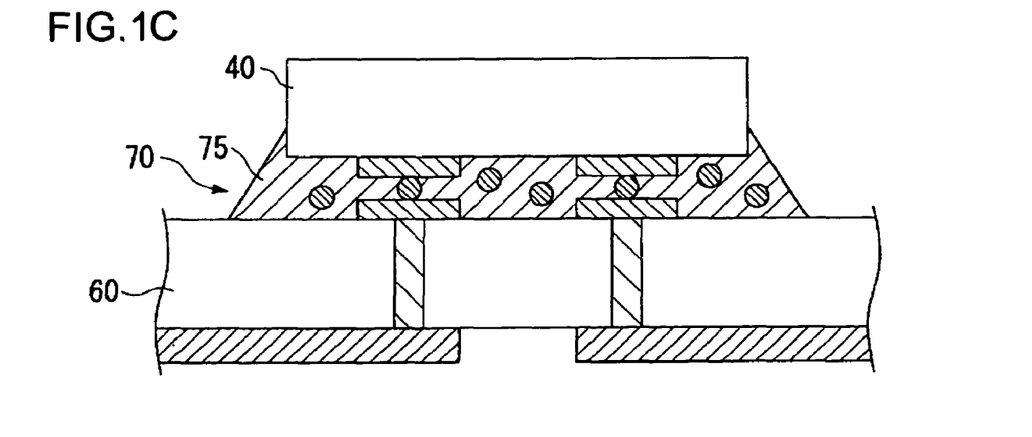

A mounting method according to an embodiment of the invention will now be described with reference to FIGS. 1(a), 1(b), and 1(c). This embodiment will be described with the drive IC 40 and the FPC 60 as a pair of mounting components. FIGS. 1(a), 1(b), and 1(c) are enlarged views of a part of the FPC 60, onto which the drive IC 40 is mounted.

Referring to FIG. 1(a), the anisotropically conductive adhesive 70 can be applied on the top surface of the FPC 60. Alternatively, the anisotropically conductive adhesive 70 may be applied on an active surface of the drive IC 40. This anisotropically conductive adhesive 70 is composed of a second liquid 75 of, for example, an epoxy resin and the microcapsules 80, as shown in FIG. 4(a), dispersed in the second liquid 75. Each of the microcapsules 80 encloses the conductive particle 81. The first liquid 85, which is, for example, an amine, is sealed between the conductive particle 81 and the capsule wall 89.

The anisotropically conductive adhesive 70 can be applied by, for example, slit coating. Slit coating is a method of evenly applying a liquid by discharging the liquid from slits having a predetermined length and disposed at regular intervals while shifting the slits in the lateral direction. This method enables efficient application of the anisotropically conductive adhesive 70 onto the mounting surface of the drive IC 40 or the FPC 60.

Referring then to FIG. 1(b), the drive IC 40 is mounted on the top of the FPC 60. The drive IC 40 is positioned on the FPC 60 so that electrodes pads 42, namely mounting conductors, provided on the active surface of the drive IC 40 are directly opposed to electrode pads 62, namely mounting conductors, provided on the top surface of the FPC 60. Bumps may be formed on the bonding surfaces of the electrode pads 42 before the mounting. The drive IC 40 is pressed on the FPC 60 at, for example, about 392 MPa (40 kgf/mm$^2$). Then, some of the microcapsules 80 are crushed between the electrode pads 42 and 62 to split their capsule walls 89, discharging the conductive particles 81 which have been enclosed in microcapsules 80. These conductive particles 81 are held between the electrode pads 42 and 62. In addition, the crushed microcapsules 80 discharge the first liquid 85. The discharged first liquid 85 reacts with the second liquid 75 around the conductive particles 81 to cure the second liquid 75, thereby bonding the electrode pads 42 and 62. As a result, the drive IC 40 and the FPC 60 are electrically connected.

To connect the drive IC 40 and the FPC 60 mechanically, referring next to FIG. 1(c), the anisotropically conductive adhesive 70 is heated, for example at about 250° C. and for about 10 seconds, while the drive IC 40 and the FPC 60 remain pressed. Alternatively, the drive IC 40 or the FPC 60 may be heated to heat the anisotropically conductive adhesive 70 indirectly.

At any portion other than between the electrode pads 42 and 62, the microcapsules 80 remain uncrushed. The capsule walls 89 of the microcapsules 80 are composed of a thermoplastic resin, as described above. Heating the anisotropically conductive adhesive 70, therefore, causes the plasticization of the capsule walls 89. This plasticization allows the capsule walls 89 to discharge the first liquid 85, which diffuses into the second liquid 75. Then, the first liquid 85 reacts with the second liquid 75 to cure the second liquid 75. The first liquid 85, which cures the second liquid 75 at normal temperatures, naturally cures the second liquid 75 during the heating. If the second liquid 75 is mixed with the third liquid, the third liquid reacts with the second liquid 75 to cure the second liquid 75.

If the capsule walls 89 of the microcapsules 80 are composed of a material other than thermoplastic resins, the capsule walls 89 are not plasticized by heating. Instead, if the second liquid 75 is mixed with the third liquid, the third liquid reacts with the second liquid 75 by heating to cure the anisotropically conductive adhesive 70 as in the state in FIG. 1(b). Thus, the overall anisotropically conductive adhesive 70 is cured to connect the drive IC 40 and the FPC 60 mechanically.

As described above in detail, the mounting method according to the present invention involves the crushing of microcapsules contained in an anisotropically conductive adhesive between an IC and an FPC by pressing to bond electrode pads provided on the IC and the FPC. This method enables the bonding of the electrode pads without heating. Therefore, even if the IC and the FPC have different linear expansion coefficients, the positions of their electrode pads do not deviate from each other. This method, therefore, can provide reliable electrical connection between the IC and the FPC. Subsequently, the anisotropically conductive adhesive is cured by heating to connect the IC and the FPC mechanically. During the heating, the positions of the electrode pads do not deviate because they have been already bonded. As a result, the IC can be reliably mounted on the FPC.

In this embodiment, the mounting of the IC onto the FPC was described. The mounting method according to the invention may also apply to the mounting of an FPC onto a glass substrate of a liquid crystal display panel. In this case, the positions of electrodes may deviate more readily because the mounting area of the FPC and the glass substrate is larger than that of the IC and the FPC. The mounting method of the invention, however, does not cause such deviation, thus providing reliable electrical connection between the FPC and the glass substrate. This mounting method may further apply to the direct mounting of an IC onto a glass substrate.

In this embodiment, a first substance and a second substance that is curable by a reaction with the first substance are used to prepare an anisotropically conductive paste. Instead of the second liquid used in the above embodiment, a solid that is curable by a reaction with the first substance may be used as the second substance to prepare an anisotropically conductive film. This film may be laminated on the mounting surface of an FPC, rather than applying the anisotropically conductive paste.

Figure 5:
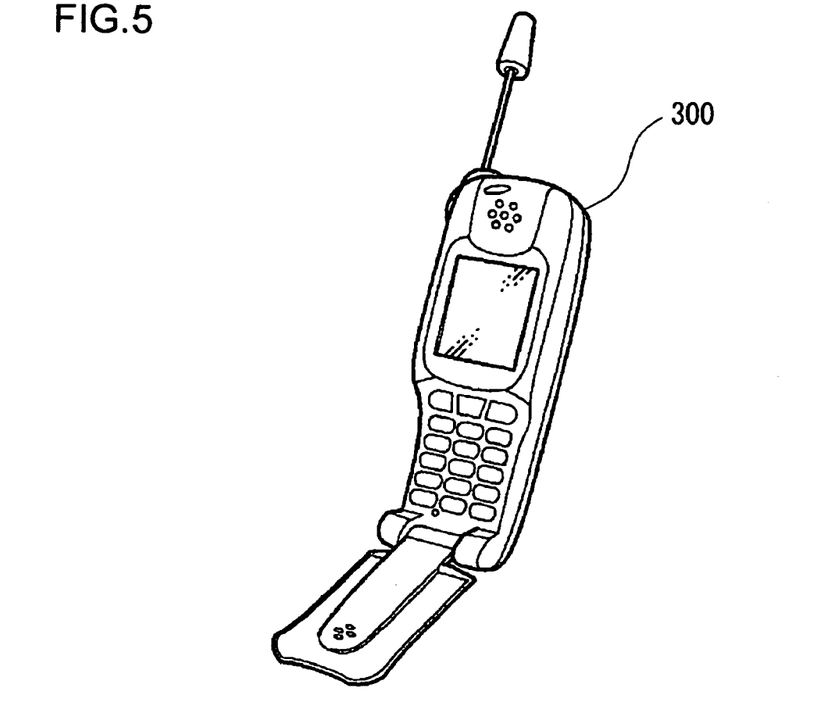
FIG. 5 is a perspective view of a cell phone.

An electronic device provided with the above electronic component module will now be described with reference to FIG. 5. FIG. 5 is a perspective view of a cell phone. The electronic component module is accommodated in a casing of a cell phone 300.

In addition to cell phones, this electronic component module may apply to various electronic devices, such as liquid crystal projectors, multimedia-compatible personal computers (PCs) and engineering workstations (EWSs), pagers, word processors, TVs, viewfinder-type or monitor-viewing video tape recorders, electronic notebooks, electronic desktop calculators, car navigators, POS terminals, and touch panel devices.

While this invention has been described in conjunction with the specific embodiments thereof, it is evident that many alternatives, modifications and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. An anisotropically conductive adhesive comprising:
   conductive particles each having a plurality of crushable microcapsules that adhere to a surface of the conductive particles, wherein each microcapsule encloses a first substance; and
   a second substance that is curable by a reaction with the first substance, the conductive particles are dispersed in the second substance;
   wherein the first substance is selected from the group consisting of amines, imidazoles, acid anhydrides, phenols and mixtures thereof; and
   the second substance is an uncured epoxy resin.

2. The anisotropically conductive adhesive according to claim 1 wherein the walls of the crushable microcapsules comprises a thermoplastic resin.

3. The anisotropically conductive adhesive according to claim 1, wherein the second substance contains a third substance that is curable by a reaction with the second substance, the reaction occurring by heating
   the third substance is selected from the group consisting of imidazoles, acid anhydrides, phenols and mixtures thereof.

4. An anisotropically conductive adhesive comprising:
   conductive particles each having a plurality of crushable microcapsules that adhere to a surface of the conductive particles, wherein each microcapsule encloses a first substance; and
   a second substance that is curable by a reaction with the first substance, the conductive particles are dispersed in the second substance;
   wherein the first substance is an uncured epoxy resin; and
   the second substance is selected from the group consisting of amines, imidazoles, acid anhydrides, phenols and mixtures thereof.

5. The anisotropically conductive adhesive according to claim 4, wherein the second substance contains a third substance that is curable by a reaction with the second substance, the reaction occurring by heating, the third substance is selected from the group consisting of amines, imidazoles, acid anhydrides, phenols and mixtures thereof.

* * * * *